United States Patent [19]

Belanger, Jr.

[11] Patent Number: 4,964,019

[45] Date of Patent: Oct. 16, 1990

[54] MULTILAYER BONDING AND COOLING OF INTEGRATED CIRCUIT DEVICES

[75] Inventor: Thomas D. Belanger, Jr., Saline, Mich.

[73] Assignee: AG Communication Systems Corporation, Phoenix, Ariz.

[21] Appl. No.: 457,626

[22] Filed: Dec. 27, 1989

[51] Int. Cl.$^5$ .............................................. H05K 1/18
[52] U.S. Cl. ................................... 361/401; 174/16.3; 174/252; 361/384; 361/385; 361/414
[58] Field of Search ............... 361/386, 388, 383, 384, 361/385, 414, 401; 357/81, 82; 174/16.3, 252; 165/80.3, 105

Primary Examiner—Leo P. Picard
Assistant Examiner—Donald Sparks
Attorney, Agent, or Firm—Robert J. Black; Gregory G. Hendricks

[57] ABSTRACT

A method to mount and cool integrated circuit chips within a multilayer printed wiring board structure. The method makes the use of tape automated bonding or flip chip dice attachment techniques in such a way that a cavity may be formed above and below the integrated circuit which will serve as a passage way for cooling.

7 Claims, 1 Drawing Sheet

MULTILAYER BONDING AND COOLING OF INTEGRATED CIRCUIT DEVICES

BACKGROUND OF THE INVENTION

1. FIELD OF THE INVENTION

The present invention relates to electrical circuit boards and more particularly to an assembly for such boards that includes the mounting of integrated circuits.

2. BACKGROUND ART

Current usage of integrated circuitry and printed wiring boards provide high density packaging of electronic circuits that has proved useful not only in saving space but also in reducing signal path length to increase the speed of circuitry. This is particularly valuable in the construction of high speed computers and similar circuitry. A number of techniques have been developed for forming integrated circuit electrical assemblies by combining circuit boards with various components including integrated circuits and the like. Particularly where integrated circuits are utilized it is possible to form assemblies of the type which include a large amount of circuitry in a relatively small package.

Several problems develop in connection with dealing with integrated circuits such as alignment and interconnection of the various leads with a particular problem being presented in certain approaches involving the use of connection leads in the form of wires which must be connected at both ends of the elements to be interconnected. To overcome this particular difficulty certain prior art techniques have been developed utilizing beam leads which extend from overlying etched circuit boards. These beam leads provide connections to various components to be connected directly to the etched circuit board.

Another major problem is that of heat dissipation. Particularly where the dissipation of heat from circuit devices located internally of a portion of a multilayer printed wiring board. Accordingly, adequate cooling is required so the circuit devices will perform without a performance degrading temperature being present. Obviously, a need is developed for a considerable amount of cooling, particularly in connection with the design of high density circuitry. Clearly, the cooling arrangement must be compact so that the advantages in miniaturized circuitry are not overcome by the necessity for providing adequate cooling arrangements.

Yet further problems are developed when integrated circuit chips are mounted onto multilayer printed wiring board structures by means of such techniques as tape automated bonding or flip chip dice attachment techniques. A better realization of the problems can be had by the three techniques that are required in connection with discussion of the present invention. These techniques include multilayer printed wiring board structures, tape automated bonding, and flip chip packaging structures. The multilayer printed wiring board typically is a laminated structure composed of several layers of etched conductor patterns supported by a backing material. These layers are aligned to each other and are laminated under temperature and pressure.

Tape automated bonding is a method to gang bond all bonding sites of an integrated circuit onto an etched conductor site supported by a backing. In this arrangement, these etched sites are then repeated along the length of the same backing material to allow for many dice to be bonded onto a continuous strip. This strip of backing material is referred to as tape. The bonds are formed by forming a eutectic alloy between the etched beams and the integrated circuit chip, or by using thermal compression. This bonding tape is then rolled onto a spool so that the bonded dice may be automatically handled for testing and final assembly.

Finally, flip chip is a method of attaching dice which require a reflow operation. The bonding sites of the dice are solder plated and are then formed into solder bumps. The dice are then assembled to the final substrate by placing the dice face down onto the substrate's conductor network and reflowed soldered.

In general, the above two methods of attachment are used to mount dice onto the surface of a substrate of both glass epoxy and ceramic. Each of the above outlined methods has a certain number of restrictions or problems which restrict their use. The application of tape automated bonding devices relies on the fabrication of a custom tape, so that the etched conductor pattern matches the bonding pads of the integrated circuit. When using the flip chip technique the chip is subjected to problems of thermal expansion and heat dissipation. The method of packaging being disclosed herein makes use of the advantages of both techniques.

SUMMARY OF THE INVENTION

In the present invention, integrated circuit chips are mounted within a multilayer printed wiring board structure. The method employed makes use of tape automated bonding or flip chip dice attachment techniques. In the process, the dice are mounted onto one layer of the structure after which the layer is mated with other layers to form the end multilayer structure. The dice mounting layer is positioned towards the center of the structure so that a cavity may be formed above and below the dice which will serve as a passage way for cooling. The cavities are then capped with a lid or the end of a cooling line which provides the needed coolant. The intent of the present invention is to provide a packaging structure which will allow for direct termination of an integrated circuit chip to a circuit and provide means to cool the device.

It clearly is the intent of the present invention to mount an integrated circuit chip directly onto the surface of one of the internal layers of a multilayer printed wiring board structure. As noted, the bonding of the chip may use the tape automated bonding or flip chip techniques. For both layers, the layers which are to be used for bonding will be designed with beam patterns where the backing will be etched away, thus leaving a free beam bonding site. The layers will be laminated both above and below the bonding layer to form a cavity in the structure where coolant may be passed if necessary. With this arrangement the die is bonded to an internal layer to form the interconnections in the openings of the cavity occurring above and below may not necessarily be sealed.

However, it is possible for the cavity opening to be sealed in several ways. In accordance with one approach, a solder mounted flange is mounted to both ends of the bond site cavity. This technique then allows a coolant to be passed across a die for direct cooling. In another approach, a lid may be soldered attached above and/or below the site to seal the site. This lid in some versions is fitted with a grill pattern of openings which will allow for the circulation of coolant, by means of air or other material. This particular technique would be useful where sealing is required, such as the use of a "glob-top" or similar encapsulant materials. Such lid designs provide for the routing of the conductor network on their surface. If it is desirable to seal a package, and maintain mechanical support, or provide a heat sink, a lid providing a pedestal or support means can also be utilized from above and/or below the integrated circuit unit.

Yet another approach is to have an opening that merely reaches the integrated circit device from the lower side of the multilayer printed wiring board arrangement with an external heat sink providing a pedestal and contact with the integrated circit, thus providing the necessary cooling for the integrated circuit.

DESCRIPTION OF THE PREFERRED EMBODIMENTS

Figure 1:
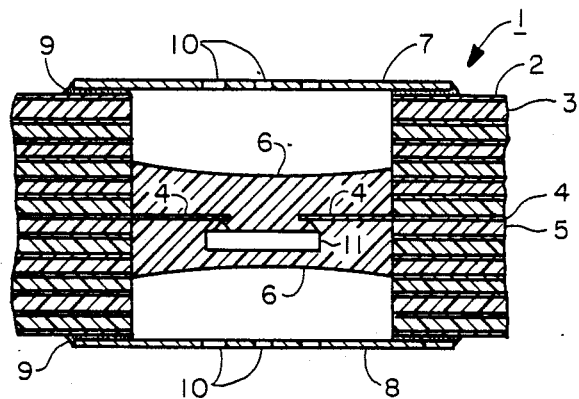
FIG. 1 is a sectional view of a multilayer printed wiring board with an integrated circuit chip mounted internally in accordance with one version of the present invention.

Referring now to FIG. 1, a multilayer printed wiring board 1 consisting of a number of layers of printed wiring board each having an etched electrically conducting surface 2 and a dielectric support layer, such as fiber glass, ceramic, etc., 3 is shown. As may be seen in the drawing, an internal cavity is provided with beams from the etched surface 4 of an internal printed wiring board which supports etched circuit conductors 4 on dielectric base 5. Portions of the etched conductor 4 which project into the cavity are bonded to integrated circuit chip 11.

Also shown in FIG. 1 is an encapsulant 6 which may or may not be utilized as a portion of the present invention. Soldered to the top surface of the multilayer printed wiring board assembly 1 is a lid 7 which contains a number of openings 10 which provide for the passage of air to the cavity. The lid 7 is affixed to the upper surface 2 of the printed wiring board multilayer arrangement 1 by means of solder 9 or adhesive.

A similar lid 8 is also secured to the bottom layer of the multilayer printed wiring board by means of solder or other adhesive techniques and it, too, includes openings 10 which allow air circulation to pass through the cavity which includes integrated circuit chip 11.

As may be seen from the foregoing, the basic concept is to mount the integrated circuit chip 11 directly onto the surface conductors 4 of one of the internal layers of the multilayer structure 1. The body of the chip may use the tape automated bonding, or flip chip technique. For both methods, the layer, such as 4, which is used for bonding, will be designed with a beam pattern wherein the backing will be etched away leaving a free beam bonding site as may be seen by reference again to FIG. 1. Additional layers are located both above and below the bonding layer to form the cavity.

Figure 2:
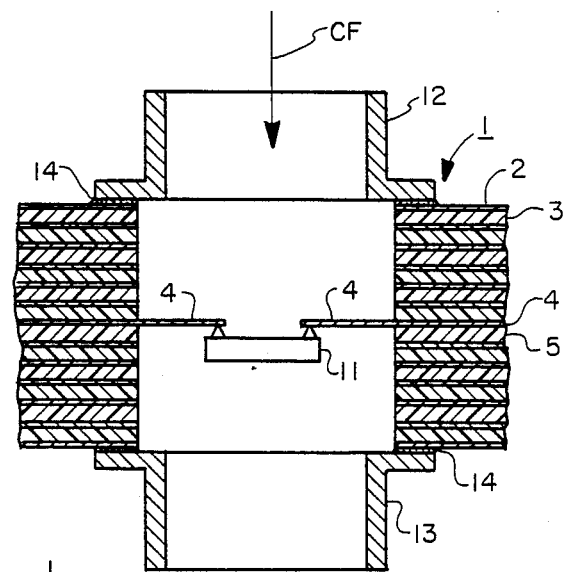
FIG. 2 is a sectional view of a multilayer printed wiring board internally mounting an integrated circuit chip showing an alternate embodiment of the present invention.

The cavity may be sealed in several ways, not only that shown in FIG. 1, which allow the passage directly across the die. As may be seen by reference to FIG. 2, flanges such as 12 and 13 may be also secured by solder 14 or similar techniques to the upper and lower layers of the multilayer structure in order to provide a direct path for a coolant of air or liquid provided from a fan or other external pump or similar source to pass a coolant directly over the integrated circuit chip and the surrounding area or cavity through the internal portion of the multilayer printed wiring board structure.

Figure 3:
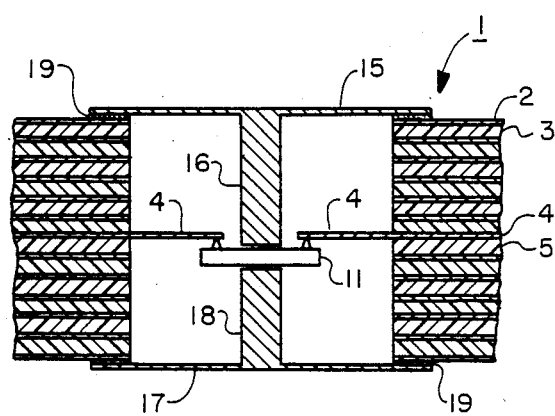
FIG. 3 discloses yet another embodiment of the present invention wherein an integrated circuit chip is mounted internally to a multilayer printed wiring board.

Referring now to FIG. 3, in those environments where it is desirable to seal the package and maintain mechanical support or provide a heat sink, lids similar to those shown in FIG. 3 may be employed wherein lid 15 is shown attached to the upper surface by solder 19 or by adhesive. This approach includes a post which may be attached to integrated circuit chip 11 from the top and which may also be of material to provide or act as a heat sink. A similar arrangement consisting of lid 17 with post 18 can be attached to the lower portion of the multilayer printed wiring board 1 by solder or other adhesive 19 and provide a heat sink and/or support to the integrated circuit chip 11 as may be seen in FIG. 3. Post 18 may be electrically connected to the device and the top surface of the backplane. This could bias the device as needed.

Figure 4:
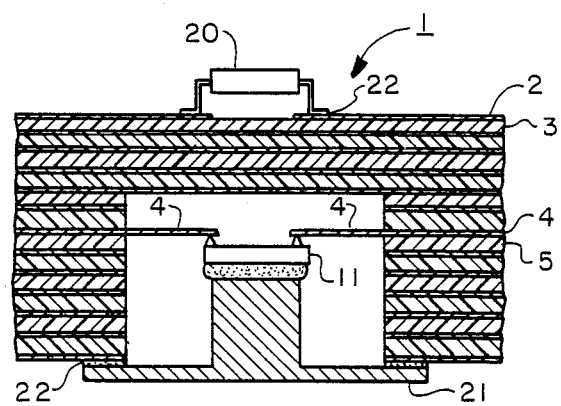
FIG. 4 is still another approach to the internal mounting of an integrated circuit within a multilayer printed wiring board.

A variation on the approach shown in FIG. 3 is that shown in FIG. 4 wherein integrated circuit device 11 contained within a cavity that projects only from the bottom surface of the multilayer printed wiring board 1 and receives additional support by means of heat sink 21 which is attached by solder 22 or similar adhesive.

As seen in FIG. 4, this arrangement provides for surface mounted devices, such as 20, to be secured to the top conductor 2 of the multilayer printed wiring board 1 by means of solder 22.

While but a few embodiments of the present invention have been shown it will be obvious to those skilled in the art that numerous modifications may be made without departing from the spirit of the present invention which shall be limited only by the scope of the claims appended hereto.

What is claimed is:

1. In combination:
    A multilayer printed wiring board including:
    a top layer;
    a bottom layer;
    and at least one intermediate layer;
    each of said layers including a top and bottom surface, an electrically insulating portion and a plurality of electrical conductor circuit elements superimposed on at least one of said surfaces;
    an aperture extending through at least a portion of said multilayer printed wiring board and including said bottom layer and a portion of said intermediate layer;
    a portion of said intermediate layer electrical conductor circuit elements projecting into said aperture;
    and an integrated circuit element positioned within said aperture, electrically connected to and supported by a portion of said intermediate layer electrical conductor circuit elements projecting into said opening.

2. The combination as claimed in claim 1 wherein:
    said aperture extends through all of said layers of said multilayer printed wiring board including the top surface of said top layer and the bottom surface of said bottom layer.

3. The combination as claimed in claim 2 wherein:
there is further included a cover over said aperture, secured to said multilayer printed wiring board top layer.

4. The combination as claimed in claim 3 wherein:
said cover includes a plurality of openings facilitating the movement of a cooling medium through said aperture and over said integrated circuit element.

5. The combination as claimed in claim 2 wherein: there is further included a cover over said aperture, secured to said multilayer printed wiring board bottom layer.

6. The combination as claimed in claim 5 wherein:
said cover includes a plurality of openings facilitating the movement of a cooling medium through said apertures and over said integrated circuit element.

7. The combination as claimed in claim 2 wherein:
there is further included a first flange extending from said top surface and a second flange extending from said bottom surface each for connection to a source of cooling medium.

* * * * *